United States Patent
Chung et al.

(10) Patent No.: US 8,703,623 B2
(45) Date of Patent: Apr. 22, 2014

(54) FABRICATION TECHNIQUE FOR GALLIUM NITRIDE SUBSTRATES

(75) Inventors: Jinwook Chung, Cambridge, MA (US); Han Wang, Cambridge, MA (US); Tomas Palacios, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 96 days.

(21) Appl. No.: 12/475,740

(22) Filed: Jun. 1, 2009

(65) Prior Publication Data

US 2010/0301347 A1    Dec. 2, 2010

(51) Int. Cl.
*H01L 21/31* (2006.01)
*H01L 21/469* (2006.01)
*H01L 31/101* (2006.01)

(52) U.S. Cl.
USPC .... 438/763; 438/787; 257/187; 257/E21.087; 257/E29.089

(58) Field of Classification Search
USPC ............ 438/118, 149, 455, 763, 787; 257/76, 257/187, 201, E21.087, E29.089
See application file for complete search history.

(56) References Cited

U.S. PATENT DOCUMENTS

| | | | | |
|---|---|---|---|---|
| 6,696,352 | B1 * | 2/2004 | Carr et al. | 438/458 |
| 7,247,889 | B2 * | 7/2007 | Hanson et al. | 257/189 |
| 2004/0004054 | A1 * | 1/2004 | Pradeep et al. | 216/13 |
| 2004/0248380 | A1 | 12/2004 | Aulnette et al. | |
| 2006/0006500 | A1 * | 1/2006 | Piner et al. | 257/613 |
| 2006/0249748 | A1 * | 11/2006 | Piner et al. | 257/183 |
| 2007/0001174 | A1 * | 1/2007 | Ring et al. | 257/76 |
| 2007/0054465 | A1 * | 3/2007 | Currie et al. | 438/455 |
| 2007/0278622 | A1 * | 12/2007 | Lester et al. | 257/615 |

FOREIGN PATENT DOCUMENTS

JP    2003152222    5/2003

OTHER PUBLICATIONS

International Search Report and Written Opinion corresponding to PCT Application Serial No. PCT/US2010/036565 mailed on Dec. 27, 2010.
Lee et al., "Wafer Bonding of Silicon Carbide and Gallium Nitride" Mat. Res. Soc. Sump. proc. vol. 681E, 2001, Materials Research Society, pp. 12.4.1-12.4.6.
Shi et al., "Interface structure and adhesion of wafer-bonded GaN/GaN and GaN/AlGaN semiconductors" 2004 American Institute of Physics, vol. 95, No. 3, pp. 909-912.
Wong et al., "Integration of GaN Thin Films with Dissimilar Substrate Materials by Pd-In Metal Bonding and Laser Lift-off" Journal of Electronic Materials, vol. 28, No. 12, 1999, pp. 1409-1413.
Wong et al., "Structural and optical quality of GaN/metal/Si heterostructures fabricated by excimer laser lift off" Applied Physics Letters, vol. 75, No. 13, Sep. 1999, pp. 1887-1889.
Funato et al., "Integration of GaN with Si using a AuGe-mediated wafer bonding technique" Applied Physics Letters, vol. 77, No. 24, Dec. 11, 2000, pp. 3959-3961.
Lauvernier et al., "Benzocyclobutene wafer bonding for III-V nanophotonic guiding structures" Electronics Letters, Oct. 13, 2005, vol. 41, No. 21, 2 pages.

* cited by examiner

*Primary Examiner* — Daniel Luke
*Assistant Examiner* — Khaja Ahmad
(74) *Attorney, Agent, or Firm* — Gesmer Updegrove LLP (57) ABSTRACT

A semiconductor arrangement is provided that includes one or more substrate structures. One or more nitride-based material structures are used in fabricating nitride-based devices. One or more intermediary layers are interposed between the one or more substrate structures and the one or more nitride-based material structures. The one or more intermediary layers support the lattice mismatch and thermal expansion coefficients between the one or more nitride-based material structure and the one or more substrate structures. Several new electronic devices based on this arrangement are described.

10 Claims, 8 Drawing Sheets

FABRICATION TECHNIQUE FOR GALLIUM NITRIDE SUBSTRATES

This invention was made with government support awarded by DOD/DARPA under Contract No. HR0011-08-1-0051. The government has certain rights in the invention.

BACKGROUND OF THE INVENTION

The invention is related to the field of nitride-based devices, and in particular to a wafer bonding technique for the fabrication of nitride-based devices.

Nitride-based transistors are playing a very important role in high frequency and high power electronics. The excellent intrinsic properties of nitride semiconductors such as large sheet charge density ($\sim 1 \times 10^{13}$ cm$^{-2}$), high peak electron velocity ($\sim 2.5 \times 10^{7}$ cm/s), high breakdown field strength ($\sim 3$ MV/cm) and good thermal conductivity ($>1.5$ W/cm·K) make them one of the best options for solid state power amplifiers, high voltage electronics, and high frequency transistors.

One important technology which can greatly improve GaN device performance as well as largely broaden its potential market and application is wafer bonding technology. In Si processing, wafer bonding has been a subject of interest for many years and it is now well developed as a basic technology both for integrated circuit (IC) and micro-electro-mechanical system (MEMS). However, in spite of its tremendous potential, the wafer bonding technology was scarcely studied in nitride semiconductors and there is very few information on using wafer bonding in GaN electronic applications.

SUMMARY OF THE INVENTION

According to one aspect of the invention, there is provided a semiconductor arrangement. The semiconductor arrangement includes one or more substrate structures. One or more nitride-based material structures are used in fabricating nitride-based devices. One or more intermediary layers are interposed between the one or more substrate structures and the one or more nitride-based material structures. The one or more intermediary layers support the lattice mismatch and thermal expansion coefficients between the one or more nitride-based material structure and the one or more substrate structures.

According to another aspect of the invention, there is provided a method of fabricating a nitride-based device. The method includes providing one or more substrate structures, and providing one or more nitride-based material structures. Also, the method includes positioning one or more intermediary layers between the one or more substrate structures and the one or more nitride-based material structures. The one or more intermediary layers support the lattice mismatch and thermal expansion coefficients between the one or more nitride-based material structure and the one or more substrate structures.

DETAILED DESCRIPTION OF THE INVENTION

The invention proposes several novel semiconductor device structures based on a new wafer bonding technique. The new wafer bonding technique and proposed novel device structures have many applications in high-frequency electronics, digital electronics, and high voltage power electronics. The invention utilizes an interlayer, for example hydrogen silsesquioxane (HSQ), as an adhesive layer. This allows unprecedented degree of freedom for advanced device structures. Some important examples include N-face GaN/AlGaN transistors, Ga-face AlGaN/GaN transistors on any substrate for high frequency operation, Si(100)-GaN—Si(100) virtual wafers for integration of GaN and Si electronics, and RESURF AlGaN/GaN power transistors.

In our invention the wafer bonding process is enabled by an intermediate-layer bond which uses HSQ layer. The HSQ is a flowable oxide which has been mainly used as a spin-on interlayer dielectric in the fabrication of integrated circuits (IC) and also used as a high-resolution negative-tone electron resist.

Figure 1A:
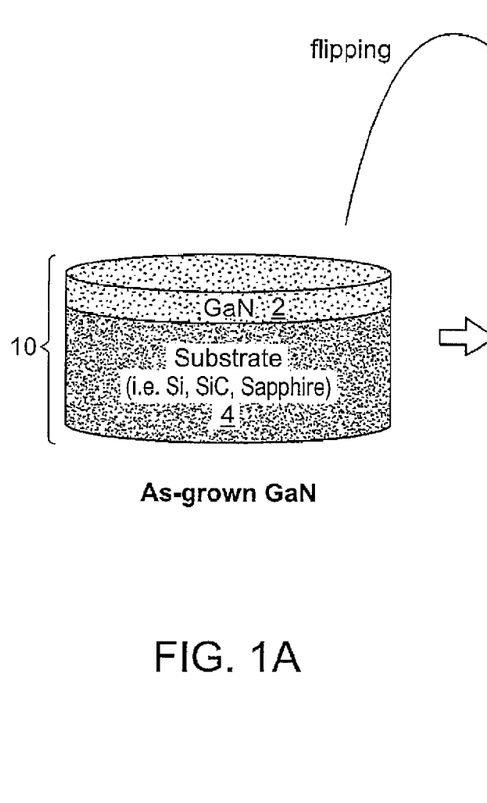
FIGS. 1A-1C are schematic diagrams illustrating the main processing steps of the novel HSQ adhesive bonding technique.
Figure 1B:
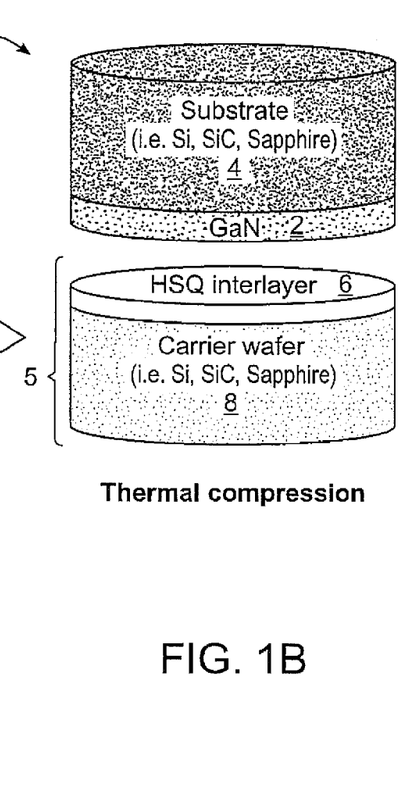
Figure 1C:
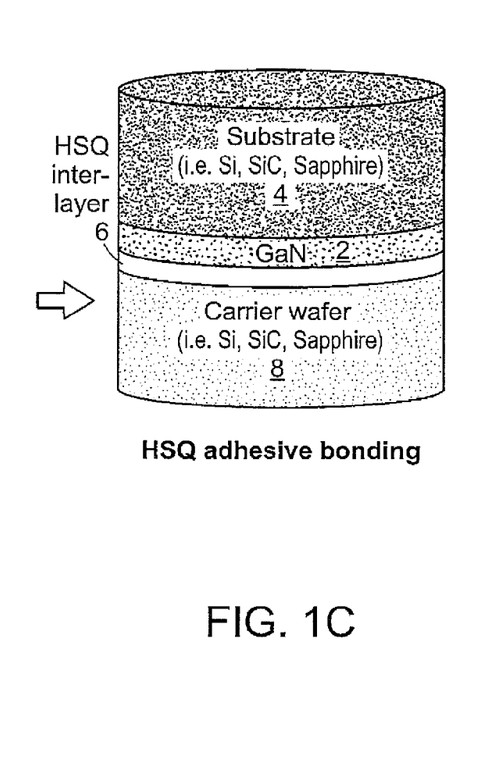

FIGS. 1A-1C shows the main processing steps of the HSQ adhesive bonding between GaN wafer 10 and carrier wafer 8. FIG. 1A shows the GaN wafer 10 including a substrate 4 and a GaN layer 2 formed on the substrate 4. Also, a HSQ interlayer 6 is spin coated on a carrier wafer 8, having silicon, sapphire, Al$_2$O$_3$, silicon carbide, diamond, or the like to form a HSQ-coated carrier wafer 5. The HSQ-coated carrier wafer 5 is baked sequentially on hot plates at 150° C. and 200° C. for 1 minute each for dehydration and planarization, respectively. Then, the HSQ-coated carrier wafer 5 is attached to the as-grown GaN wafer 10 and thermally compressed at high temperature (>400° C.) for an hour, as shown in FIG. 1B. The GaN wafer 10 is flipped so as to allow the GaN layer 2 to be in direct contact with the HSQ interlayer 6. The elevated temperature hardens the HSQ layer 6 and forms an extremely stable bond between the GaN wafer 10 and the carrier wafer 8, as shown in FIG. 1C.

Figure 2:
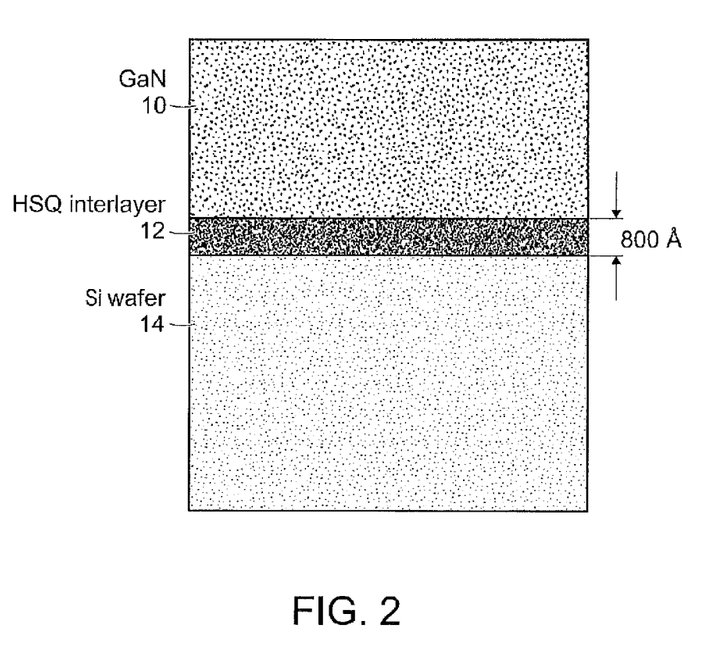
FIG. 2 is a scanning electron micrograph of a successfully processed bonding between a GaN 10 and Si carrier 14 wafers in accordance with the invention (False color is added to highlight the HSQ layer 12 in the structure)

FIG. 2 shows a scanning electron micrograph of a successfully processed bonding between a GaN 10 and Si carrier 14 wafers using a HSQ interlayer 12. At elevated temperature (>400° C.), HSQ is converted into SiO$_2$ and a relatively thick HSQ interlayer (>30 nm) is used to have robust defect-free bond.

Some of the advantages of the new bonding technology based on HSQ are described below. First of all, the HSQ layer is able to stand the high thermal budget required during the processing of GaN devices. For example, the thermal stability of HSQ bonding of GaN and Si wafers is tested by applying rapid thermal annealing (RTA) 870° C. for 30 seconds, which is necessary to have good ohmic contacts in GaN device processing. Also, the stability of HSQ bonding up to 1300° C. is confirmed. This bonding is able to support the large lattice mismatch (17%) and thermal expansion coefficients (55%) between GaN and Si. Secondly, spin-coated HSQ has a very uniform surface profile (surface roughness is less than 40 Å) which is critical to avoid any void at the bonding interface. Finally, HSQ is a low dielectric material (dielectric constant=2.8) and can minimize parasitic capacitances. This property is very desirable to assure for the high frequency performance of the electronic and optoelectronics devices, when the device is operating above this layer.

Many applications can be envisioned for the proposed HSQ adhesive bonding. Some of important examples include N-face GaN transistors, Ga-face GaN transistors on any substrate, integration of GaN with Si electronics and RESURF GaN power devices described herein.

Although most of the reported GaN devices have been fabricated on nitride structures grown along the c-direction (i.e. Ga-face), N-face GaN/AlGaN transistors have the potential of higher electron confinement and lower contact resistances. However, in spite of this promise, the performance of N-face devices is still much lower than in Ga-face devices due to the inferior material quality. Although N-face devices have been grown by molecular beam epitaxy and, recently, by metal-organic chemical vapor deposition (MOCVD), the growth of N-face nitrides is much more challenging than the growth of the more stable Ga-face structure. The invention presents a novel technique to fabricate N-face GaN/AlGaN HEMTs based on the HSQ adhesive bonding and substrate removal.

Figure 3A:
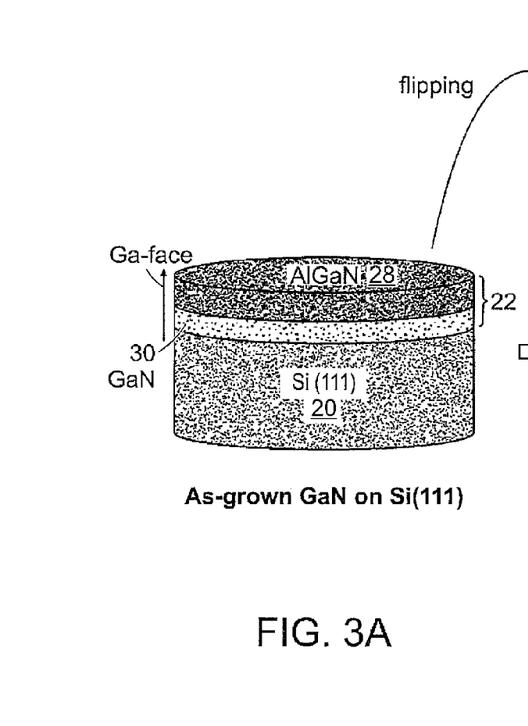
FIGS. 3A-3C are schematic diagrams illustrating the main processing steps in the fabrication of a N-face GaN on Si(100) substrate formed in accordance with the invention.
Figure 3B:
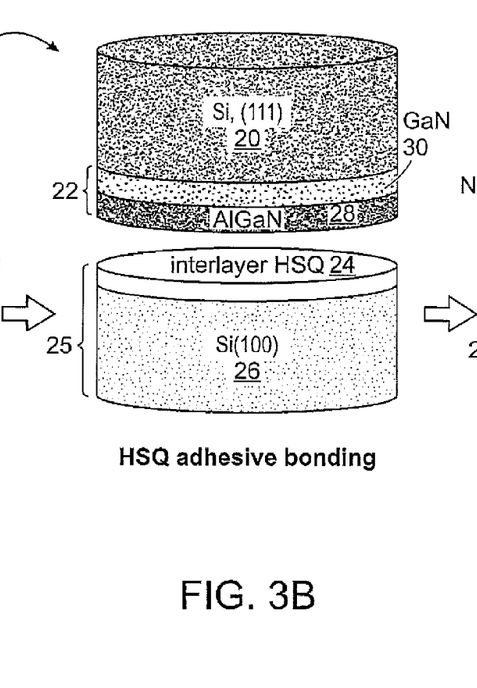

FIGS. 3A-3C shows the main processing steps in the fabrication of an N-face GaN on Si(100) substrate. A Ga-face AlGaN/GaN transistor structure 22 is grown on a Si(111) substrate 20, as shown in FIG. 3A. The AlGaN/GaN transistor structure 22 includes a GaN buffer layer 30 and an AlGaN layer 28 grown on the GaN buffer layer 30. To have access to the N-face of these samples, the inventive HSQ adhesive bonding is used. In particular, a HSQ interlayer 24 is spin coated on a carrier wafer 26, having Si(100) to form a HSQ-coated carrier wafer 25, as shown in FIG. 3B. Then, the HSQ-coated carrier wafer 25 is attached to the as-grown AlGaN/GaN transistor structure 22 and thermally compressed, as shown in FIG. 3B. The AlGaN/GaN transistor structure 22 is flipped so as to allow the AlGaN layer 28 to be in direct contact with the HSQ interlayer 24.

Figure 3C:
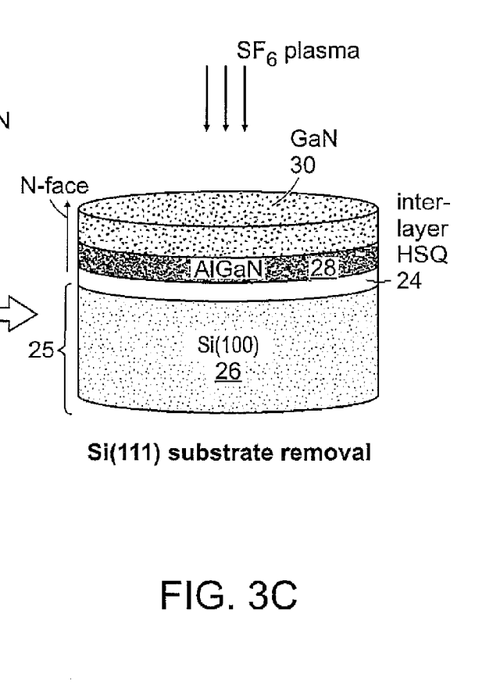

After the HSQ adhesive bonding, the original Si(111) substrate 20 is completely removed by dry etching using an $SF_6$-based plasma, as shown in FIG. 3C. The GaN buffer 30 is an effective etch-stop layer for the $SF_6$ plasma etch and a smooth N-face GaN surface is obtained at the end of the etch. After the substrate transfer, the N-face GaN buffer 30 is etched by dry etching technique, for example electron cyclotron resonance reactive ion etching (ECR-RIE) with $Cl_2/BCl_3$ gas mixture, until the desired distance between the N-face GaN surface and the AlGaN/GaN interface is achieved. Etch-stop layers can be inserted in the original nitride structure to allow a highly reproducible etch. Finally, a very good quality N-face GaN transistor structure which is grown along Ga-face is produced.

Figure 4A:
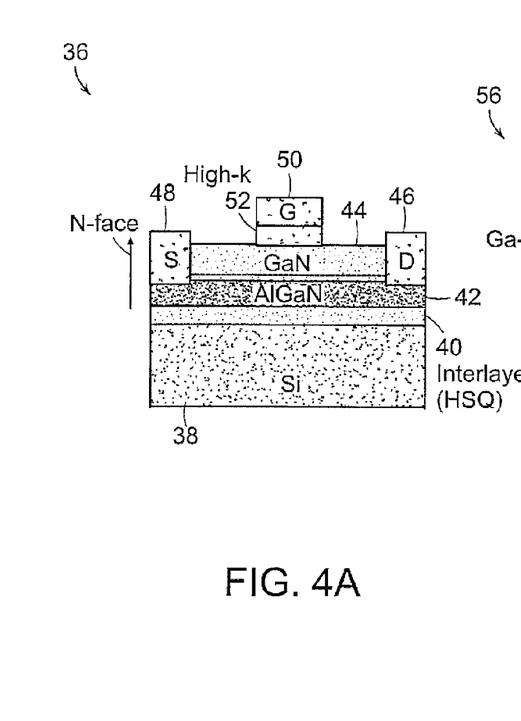
FIGS. 4A-4C are schematic diagrams illustrating N-face GaN/AlGaN high electron mobility transistors (HEMTs) formed in accordance with the invention, reference standard Ga-face AlGaN/GaN HEMTs, and new GaN HEMT structure that has less parasitics.

FIG. 4A shows the schematic diagram of proposed N-face GaN/AlGaN high electron mobility transistors (HEMTs) 36. In particular, FIG. 4A illustrates HEMT 36 having a Si substrate 38 and a HSQ interlayer 40 formed on the substrate 38. An AlGaN layer 42 is formed on the HSQ interlayer 40. A GaN buffer layer 44 is formed on the AlGaN layer 42. The drain 46 and source 48 of the HEMT 36 are formed on the AlGaN layer 42. The gate 50 of the HEMT 36 is formed on a high-K dielectric 52. The high-K dielectric 52 is formed on the GaN buffer layer 44.

Figure 4B:
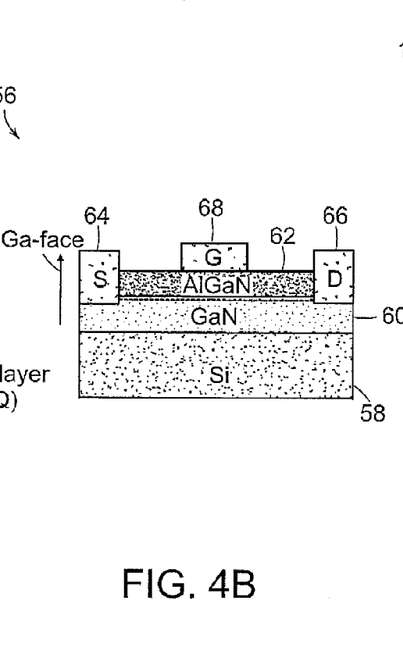

FIG. 4B shows a standard Ga-face AlGaN/GaN HEMT 56 being reference embodiment to the HEMT 36. The HEMT 56 includes a Si substrate 58 and a GaN buffer layer 60 formed on the Si substrate 58. Also, a AlGaN layer 62 is formed on the GaN buffer layer 60. The source 64 and drain 66 of the HEMT 56 are formed on the GaN buffer layer 60. The gate 68 is formed on the AlGaN layer 62.

Some key features of the structure 36 compared to standard the Ga-face AlGaN/GaN HEMT 56 of FIG. 4B are lower ohmic contact resistances (<0.2Ω·mm) achieved by depositing metals directly to the GaN buffer layer 44, which has a narrower bandgap than AlGaN. In the Ga-face HEMT structure 56, the ohmic contacts 46, 48 are deposited on the AlGaN layer 62 and the very large bandgap of AlGaN makes the contact resistance high (0.3~0.5Ω·mm).

Electron confinement improves in this structure because the electrons are confined in the channel by the surface potential as well as conduction band discontinuity due to AlGaN buffer. On the other hand, when one pinch-off the Ga-face HEMTs, electrons can go deep into GaN buffer and it is very difficult to confine the electrons in the channel especially in deep submicron gate transistors.

AlGaN-free surface in this structure increases activation yield of implantation. When the implantation to GaN is done, the activation yield is very low in Ga-face HEMT structure because many ionized species stays in top AlGaN layer. However, in N-face structure one can achieve high activation yield of implantation because now the top surface is GaN.

Figure 4C:
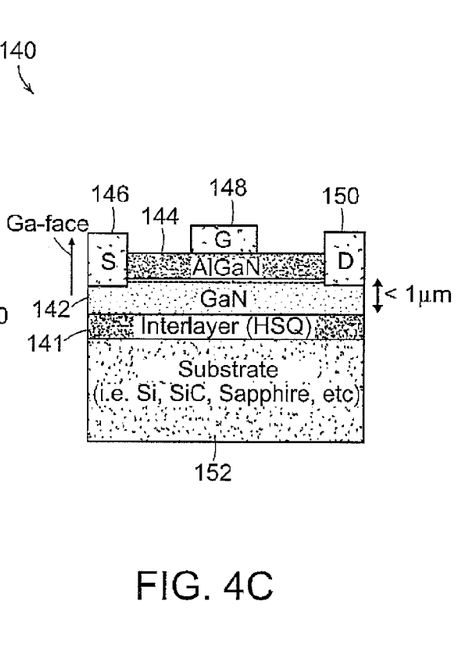

FIG. 4C shows a Ga-face AlGaN/GaN HEMT structure 140 similar to that of FIG. 4B except a HSQ layer 141 is positioned between a substrate 152 and the GaN layer 142. The substrate 152 in this arrangement 140 can include Si, SiC, sapphire, or the like. The GaN layer 142 can have thickness greater than 1 µm. The source 146 and drain 150 of the HEMT 140 are formed on the GaN buffer layer 142. The gate 148 is formed on the AlGaN layer 144.

Transport properties (mobility, carrier density, sheet resistance) are improved in these structure by the HSQ adhesive bonding and substrate removal processing. It has been shown that 60% higher carrier density and 50% lower sheet resistance in N-face HEMT structure compared to Ga-face HEMT structure. The change in the surface Fermi level pinning when the N-face surface is exposed and possible piezoelectric charges induced by relaxing strain after the Si substrate removal are believed to be partly responsible for this improvement.

The fabrication technology of N-face GaN HEMTs can be also used to fabricate new GaN HEMT structure shown in FIG. 4C to reduce defects and parasitic that degrade device performance. FIG. 4C shows GaN HEMT with HSQ interlayer between GaN buffer and any substrate (i.e. Si, SiC, sapphire, diamond, etc). GaN buffer is etched a few µm and annealed prior to make HSQ adhesive bond to the substrate. When GaN is grown on any substrate, there are inevitable defects or dislocations at the interface mainly due to lattice mismatch. In many cases, they play as trap centers and degrade device performance and reliability. Also, without HSQ interlayer Ga atoms can diffuse into the substrate during the device processing (i.e. high temperature annealing) and make substrate conductive. This significantly increases parasitic resistances and capacitances especially when it is operating at high frequencies.

The HSQ adhesive bonding also allows the fabrication of Si(100)-GaN—Si(100) virtual wafers. This new virtual wafers allows to seamlessly integrate AlGaN/GaN high electron mobility transistors (HEMTs) and other nitride devices (LEDs, lasers, surface acoustic wave filters and sensors, detectors) with state-of-the-art Si(100)-based CMOS circuits on-wafer to achieve revolutionary design flexibility and unprecedented circuit performance levels.

Any technology that aims to successfully integrate GaN and Si electronics on the same wafer needs to be fully compatible with state-of-the-art Si CMOS processing. To assure this compatibility, some of the main considerations include the need of a planar Si(100) surface on both sides of the wafer (i.e. any required non-CMOS materials should be buried in the wafer), scalability to large wafer diameters and the compatibility with the strict thermal budget of Si CMOS processing. Also, although the requirements for the fabrication of III-V devices are normally more relaxed, special caution is needed to not degrade the performance of the Si CMOS devices after their fabrication. In this disclosure, we will demonstrate a technology to seamlessly integrate GaN and Si electronics on-wafer. This technology is compatible with all the considerations outlined previously and it is based on the fabrication of Si(100)-GaN—Si(100) virtual substrates as shown in FIGS. 5A-5G.

Figure 5A:
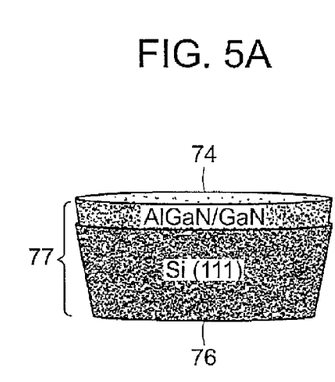
FIGS. 5A-5G are schematic diagrams illustrating the main processing steps for the fabrication of Si(100)-GaN—Si(100) virtual substrates.
Figure 5B:
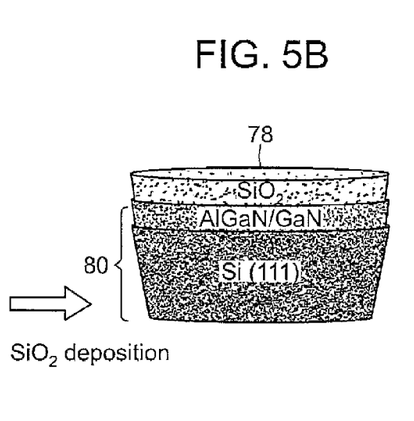
Figure 5C:
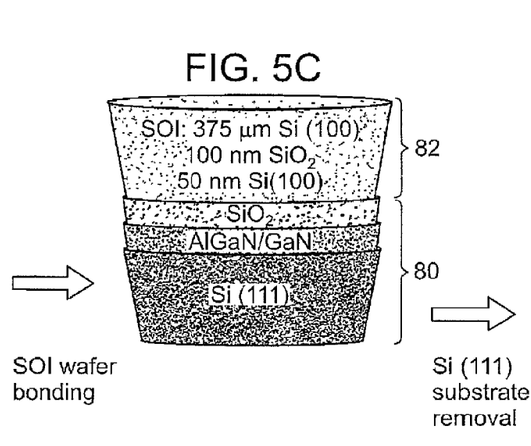
Figure 5D:
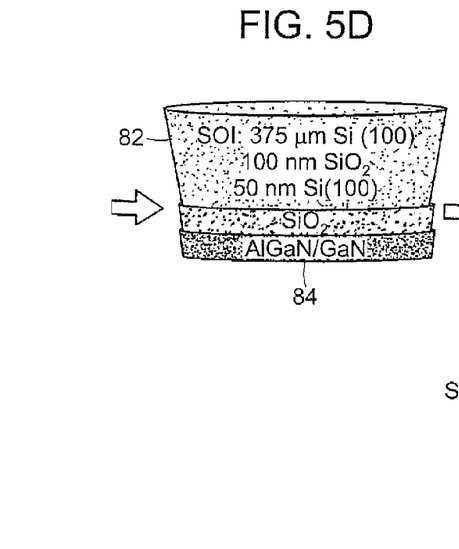
Figures 5E, 5F:
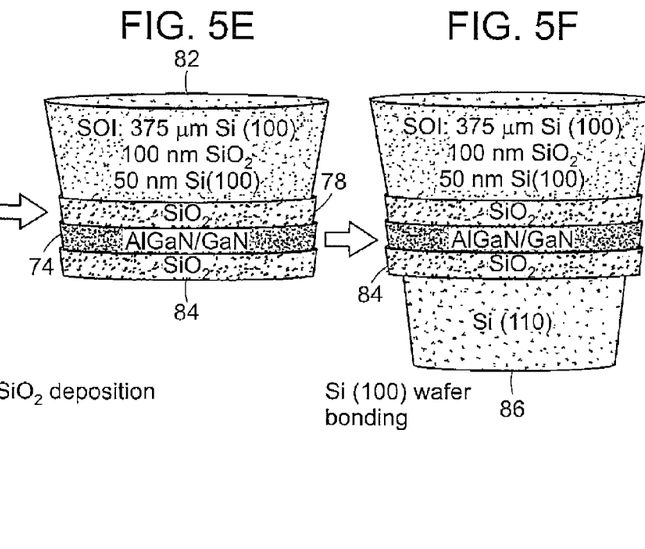
Figure 5G:
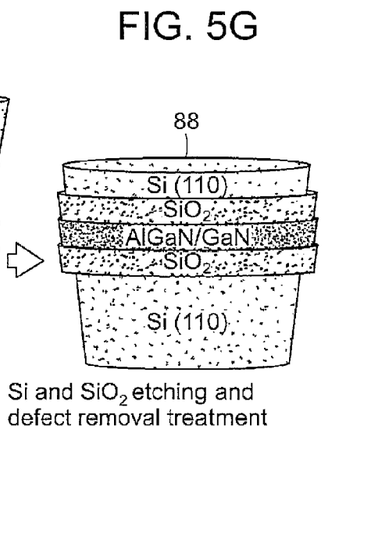

The initial wafer is an AlGaN/GaN HEMT structure 74 grown on a Si(111) substrate 76, as shown in FIG. 5A. A silicon dioxide layer 78 is deposited on the HEMT structure 74 to form a wafer 80, as shown in FIG. 5B. This wafer 80 is bonded to a Silicon-on-Insulator (SOI) wafer 82, as shown in FIG. 5C. The SOI wafer 82 includes a first Si (100) layer having a thickness of 375 μm, a SiO$_2$ layer having a thickness of 100 nm, a Si (100) epilayer having a thickness of 50 nm that can be used later during the Si CMOS processing. The Si(111) substrate is removed to reduce thermal expansion mismatch with the SOI wafer 82, as shown in FIG. 5D. A second silicon dioxide layer 84 is formed on the exposed AlGaN/GaN HEMT structure 74, as shown in FIG. 5E. A Si(100) wafer 86 is bonded to the bottom on the AlGaN/GaN structure 74 to provide mechanical support using the second dioxide layer 84, as shown in FIG. 5F. The first Si (100) layer and the SiO$_2$ layer of the SOI wafer 82 are removed with selective wet etches and a defect removal treatment is applied to the remaining the Si(100) epilayer 88 to make it ready for CMOS fabrication, as shown in FIG. 5G. The silicon dioxide layers 74 and 84 can be the HSQ interlayers described herein.

Figure 6A:
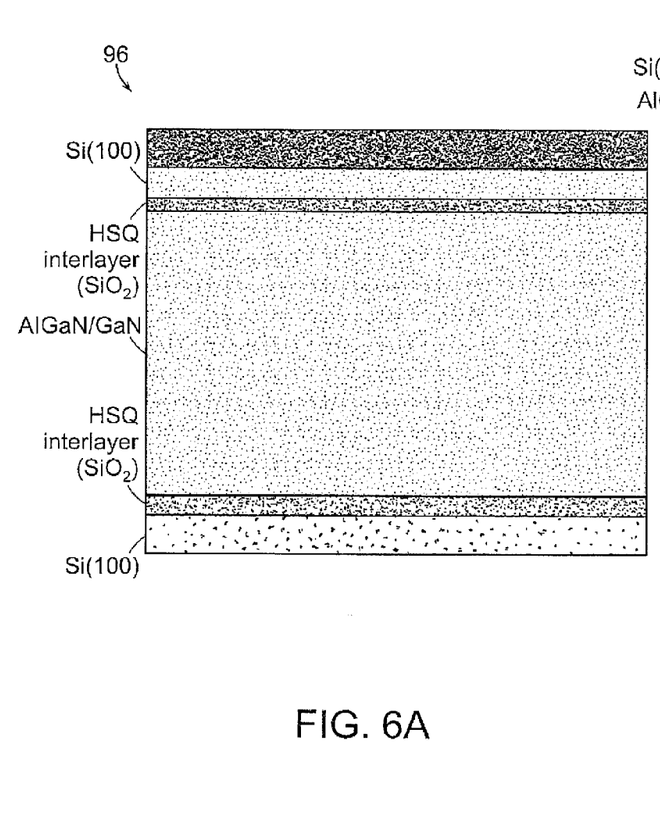
FIGS. 6A-6B show a scanning electron micrograph (SEM) of successfully processed Si(100)-GaN—Si(100) virtual wafer and plan-view SEM of fabricated Si MOSFETs and GaN HEMTs on this virtual wafer in the accordance with the invention.

FIG. 6A shows a scanning electron micrograph of successfully processed Si(100)-GaN–Si(100) virtual wafer 96 as described in FIGS. 5A-5G. Note the step shown in FIGS. 5D-5F could be removed in case a Si(111) substrate is allowed. Also, in this case, Si(111) substrate can be substituted to sapphire, silicon carbide, diamond, or the like substrates.

Figure 6B:
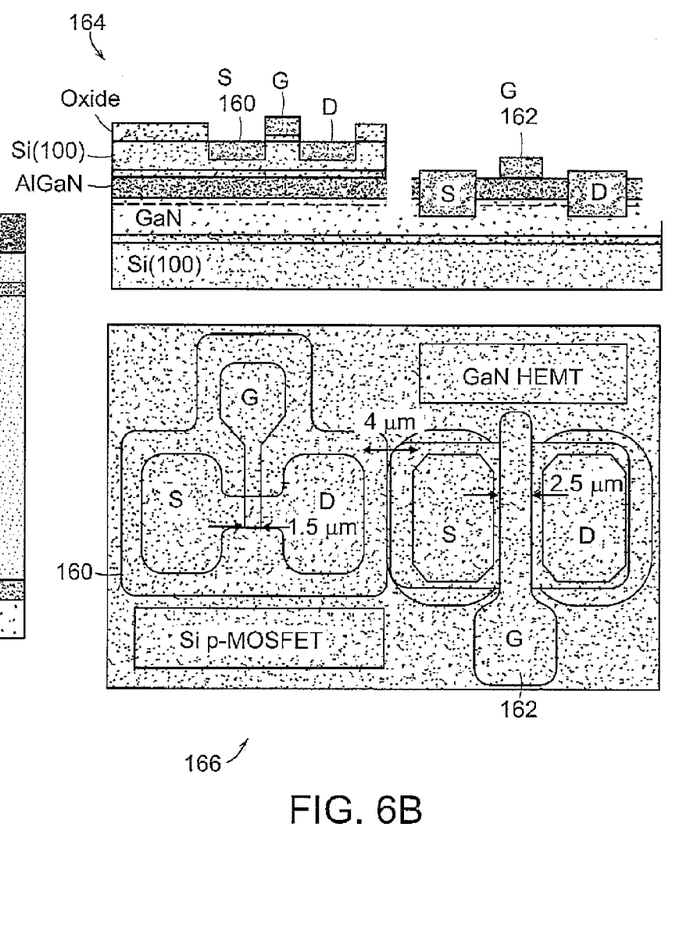

The virtual substrate fabricated according to FIGS. 5A-5G is fully compatible with state-of-the-art Si CMOS processing. After the fabrication of the Si devices, the top Si epilayer and the SiO$_2$ layer (150 nm in thickness) are locally removed by selective chemical etching to allow the fabrication of the GaN devices. FIG. 6B shows a cross-section schematic view 164 of fabricated Si MOSFETs 160 and GaN HEMTs 162 and a plan-view 166 SEM image of the fabricated transistors 160, 162.

The invention provides the first attempt to integrate GaN based devices and Si(100) CMOS electronics on-wafer. This integration will open doors to many new circuits and systems with improved performance. High power digital-to-analog converters (DACs) using GaN and Si transistors can allow a much larger dynamic range and at least a ×10 fold improvement in output power level. High speed differential amplifiers can be produced using GaN transistor formed in accordance with the invention, where the higher electron velocity and mobility of GaN can allow more than ×2.5 improvement in speed. The close integration of GaN and Si electronics will allow highly compact power amplifiers with very high linearity and efficiency. New enhancement-mode power transistors can be produced where the gate of a normally-ON GaN power transistors is connected to a normally-OFF Si transistor to fabricate a new normally-PFF device ($V_T$>4V) with unprecedented combination of blocking voltage and ON-resistance. Buffer stages for ultra-low-power electronics can be produced. The use of GaN amplifiers in the output buffer stages of Si chips would allow a substantial reduction of circuit complexity, losses and parasitic capacitances which would be especially useful in ultra-low-power electronics. GaN-based power inverters for local power distribution in Si electronics can be developed as well as AlInGaN-based optoelectronic, acoustic and energy harvesting devices integrated with Si electronics.

Figure 7:
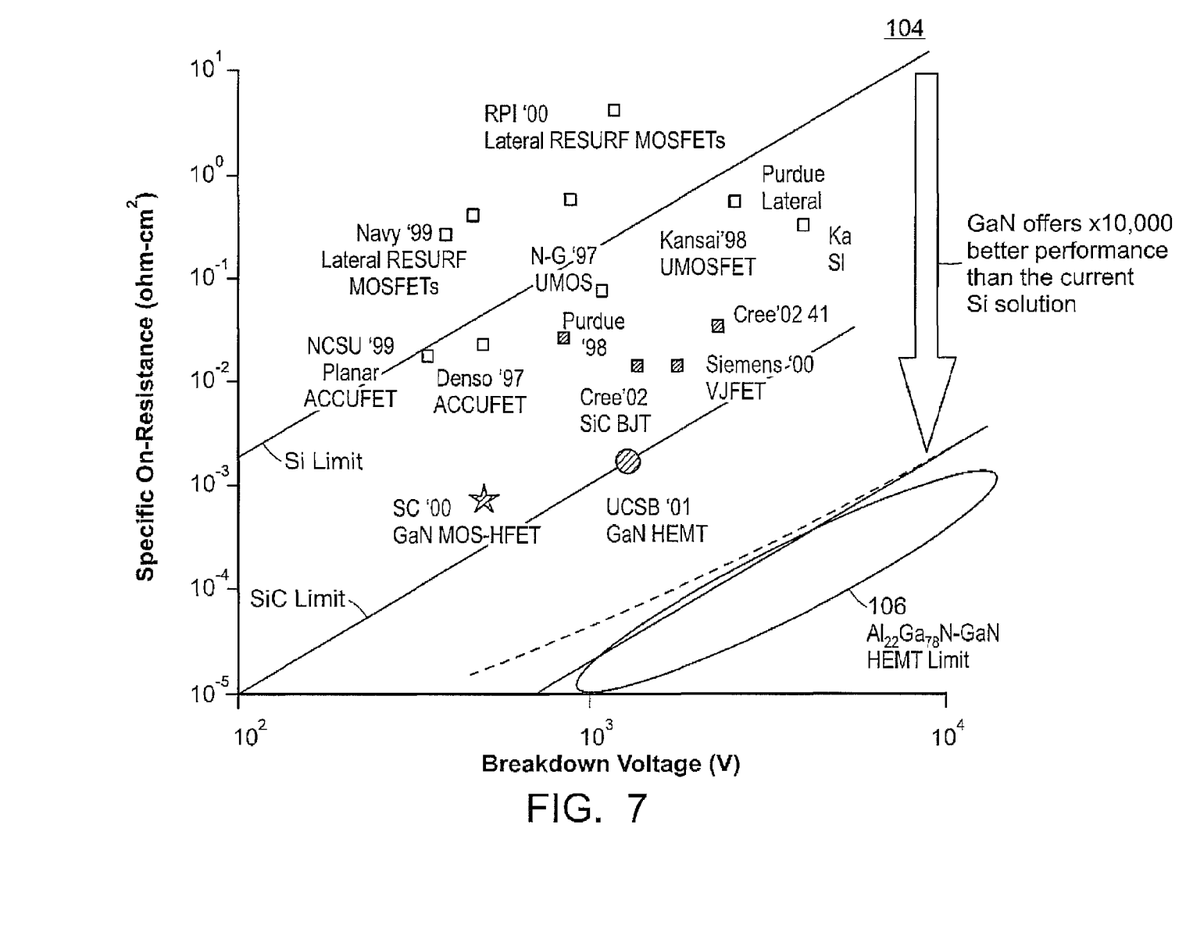
FIG. 7 are graphs illustrating the performance of nitride-based devices.

As shown in FIG. 7, nitride-based devices have outstanding properties for high voltage power applications. For the same breakdown voltage, GaN-based devices offer almost ×1000 lower on-resistance than Si devices, which would allow much lower resistive and switching losses. The performance of these devices could be improved even further if techniques such as RESURF structures are used, however no AlGaN/GaN based devices, which have RESURF structure, have been fabricated until now. The RESURF structure has the potential to push the performance of nitride HEMTs even beyond the 1-D HEMT limit, as shown on graph 104.

The main challenges for the fabrication of RESURF structures lies in the difficulty to grow p-type GaN. Poor doping quality together with the presence of many traps in p-type GaN result in very poor electronic properties that seriously hinders the development of RESURF HEMTs. The new RESURF device structure and the related fabrication methods based on wafer bonding as described in this disclosure aim to overcome this by attaching other p-type materials, such as p-type SiC, to the substrate using HSQ. Using these structures and fabrication methods, the aim is to build power devices that can operate in the unprecedented performance region 106 of FIG. 7, of RESURF HEMTs in terms of trade-off between on-state resistance and breakdown voltage.

The invention presents novel RESURF structures for GaN-based power devices that can be fabricated using the inventive wafer bonding technique. The new structure combines the excellent transport properties of GaN HEMTs (i.e. low ON resistance) with the charge compensation capabilities of RESURF structures. The latter helps the HEMTs achieving significant improvements in breakdown voltage comparing to standard HEMTs with similar on-state and switching performance. These new structures can be used to improve breakdown voltage of both low-voltage and high-voltage devices and will be an enabling step to significantly improve the blocking capabilities of nitride transistors for all types of applications. Examples of high-voltage applications include hybrid vehicles, high efficient solar cells with integrated power inverters and more reliable high power transmission lines controlled and monitored by solid state power electronics.

Figure 8A:
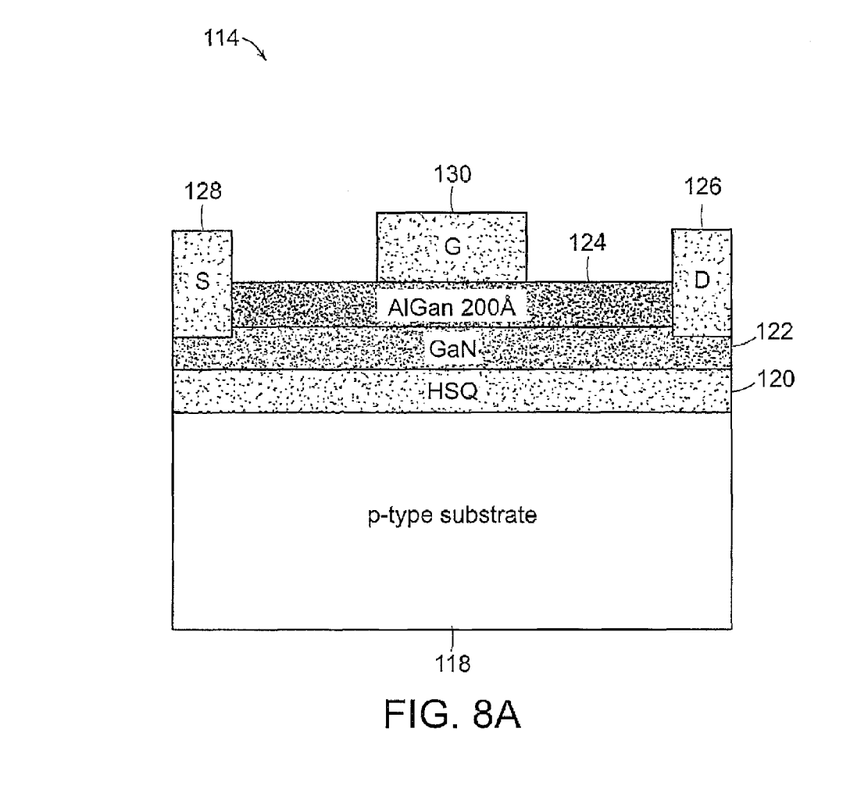
FIGS. 8A-8B are schematic diagrams illustrating two embodiments of power devices formed in the accordance with the invention
Figure 8B:
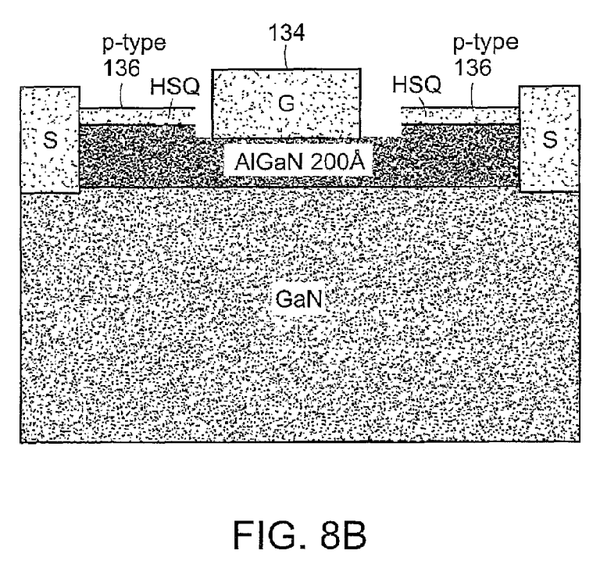

FIGS. 8A-8B show schematic diagrams of two embodiments of power devices formed in the accordance with the invention. FIG. 8A shows p-type substrate RESURF 114 and FIG. 8B shows a p-type top layer RESURF 116. These structures 114, 116 can be easily fabricated using the HSQ adhesive bonding similar to FIGS. 5A-5G.

The p-type substrate RESURF structure 114 in FIG. 8A is based on a source-connected p-type substrate (e.g. p-type Si, SiC, GaN etc.) 118 that compensates for charge in the GaN layer 122 during off-state. This charge compensation between the substrate 118 and the GaN layer 122 results in a depletion region formed on both sides of the HSQ layer 120. Since the GaN layer 122 is very thin compared to the gate-to-drain distance (typically with a 1:10 ratio), the depletion region along the lateral junction of HSQ layer 120 will reach the edge of the GaN layer 122 and even advance into the AlGaN layer 124 well before significant electric field in the horizontal direction is set up between the gate 130 and the drain 126. The resultant electric field along the channel between the gate 130 and the drain 126 becomes flat, rather than triangular in standard HEMTs. The device will most likely break either under the gate region 130 or at the drain 120 where the peak electric fields occur. The optimal breakdown performance can be achieved by carefully designing the separation between the p-type substrate 118 and 2 DEG. Simulation shows 30% improvement in breakdown voltage when p-type substrate is 100 nm separated from the 2 DEG channel with 100 nm HSQ interlayer.

The wafer bonding technology used to fabricate this device introduces an HSQ layer 120 between the p-type substrate 118 and the GaN layer 122 as shown in FIG. 8A. While the HSQ layer 120 will reduce the charge compensation effect of the p-type substrate 118 on the GaN channel 122, this layer 120 of HSQ can also reduce the peak electric field at the drain, allowing an additional control parameter for the designer. The thickness of GaN layer and 122 and the substrate 118 can be thinned to reduce parasitic resistances and capacitances which degrade device performance. The device 116 in FIG. 8B is an alternative design of the RESURF structure 114 of FIG. 8A with the p-type layers 134 being position on HSQ layers 136 and an AlGaN layer 138.

Although field plates are not shown in FIGS. 8A-8B, the inventive RESURF structures 114, 116 and the fabrication processes are fully compatible with many field plate designs for improving breakdown voltage.

The invention presents a new wafer bonding technology as well as its important applications to fabricate N-face GaN transistors, Si(100)-GaN—Si(100) virtual wafer for GaN—Si integration, and RESURF GaN power devices with p-type substrate. First, N-face GaN transistor is ideal for high frequency electronics, mainly amplifiers, because of its capability to lower ohmic contact resistances and improve carrier confinement. These characteristics can largely improve the high frequency performance of GaN transistors beyond current state-of-the art. Secondly, the integration of AlGaN/GaN HEMTs with Si metal-oxide-semiconductor field effect transistors (MOSFETs) at the individual transistor level would allow the combination of the outstanding high-frequency and high-power performance of nitride semiconductors with the flexibility and unmatched scaling capability of Si technology.

Finally, the RESURF GaN device structures can significantly improve the breakdown voltage of the devices when compared to standard AlGaN/GaN HEMTs with similar on-state and switching performance. These new devices will allow important new improvements on power electronics.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a nitride-base device comprising: providing one or more substrate structures;
providing one or more nitride-based material structures fabricated independently from said one or more substrate structures, said one or more nitride-based material structures are grown on a silicon substrate and said one or more intermediary layers that comprises a coated material with a thickness of at least 30 nm and are formed on a carrier wafer using spin-coating;
directly positioning one or more intermediary layers having insulating materials between said one or more substrate structures and said one or more nitride-based material structures, said one or more intermediary layers supporting the lattice mismatch and thermal expansion coefficients between said one or more nitride-based material structures and said one or more substrate structures;
attaching said carrier wafer after coating to said one or more nitride-based structures by thermal compression and flipping down a side of the silicon substrate with the one or more nitride-based material structures to make a direct contact with the one or more intermediary layers; and
completely removing the silicon substrate by dry etching to obtain a smooth N-face, wherein the one or more nitride-based material structures function as an etch-stop layer.

2. The method of claim 1, wherein said one or more substrate structures comprise Si (100), Si (111), SiC, $Al_2O_3$AlN, diamond or sapphire.

3. The method of claim 1, wherein said one or more nitride-based material structures comprise $Al_xIn_yGa_zN$.

4. The method of claim 1, wherein said one or more substrate structures have been locally removed to expose a buried structure where devices are fabricated.

5. The method of claim 1, wherein said one or more intermediary layers comprise silicon dioxide.

6. The method of claim 1, wherein said one or more substrate structures are doped p-type.

7. The method of claim 4, wherein said device comprises a N-face GaN transistor.

8. The method of claim 4, wherein said device comprises a GaN-based power device.

9. The method of claim 1, wherein said one or more nitride-based material structures comprise $Al_xIn_yGa_zN$/GaN transistor structures.

10. The method of claim 9, wherein said device comprises a Ga-face GaN/$Al_xIn_yGa_zN$ transistor.

* * * * *